(12) United States Patent
Stevenson et al.

(10) Patent No.: US 7,777,587 B2
(45) Date of Patent: Aug. 17, 2010

(54) MINIMUM PULSE WIDTH FOR PULSE WIDTH MODULATION CONTROL

(75) Inventors: Brian Stevenson, Rancho Santa Margarita, CA (US); Parviz Parto, Laguna Niguel, CA (US); Yang Chen, Long Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 191 days.

(21) Appl. No.: 12/187,359

(22) Filed: Aug. 6, 2008

(65) Prior Publication Data

US 2010/0033261 A1 Feb. 11, 2010

(51) Int. Cl.
*H02M 3/335* (2006.01)
*H03K 7/08* (2006.01)

(52) U.S. Cl. .......................... 332/109; 363/26
(58) Field of Classification Search ......... 332/109–111; 327/172–177; 363/26, 41; 375/238
See application file for complete search history.

(56) References Cited

U.S. PATENT DOCUMENTS 4,471,283 A * 9/1984 Presley ....................... 318/696
6,342,822 B1 1/2002 So
7,026,795 B2 4/2006 So

OTHER PUBLICATIONS

Bryson. Using auto-zero comparator techniques to improve PWM performance (Part 1 of 2), Jun. 23, 2008 [online], [retrieved Jul. 18, 2008]. Retrieved from Internet <http://www.planetanalog.com/showArticle.jhtml?articleID=208800308>.
Bryson. Using auto-zero comparator techniques to improve PWM performance (Part 2 of 2), Jun. 26, 2008 [online], [retrieved Jul. 18, 2008]. Retrieved from Internet <http://www.planetanalog.com/showArticle.jhtml?articleID=208800314>.

* cited by examiner

*Primary Examiner*—David Mis
(74) *Attorney, Agent, or Firm*—Fulwider Patton LLP (57) ABSTRACT

The rising edge of a pulse width modulated output signal occurs after an input ramp signal starts to rise. The ramp signal starts to rise after the rising edge of a periodic set signal and before the falling edge of a periodic set signal. A feedback control signal intersects a substantially linear region of the ramp signal to generate a reset signal using a PWM comparator. The periodic set signal and reset signal are input to a latching circuit to generate the pulse width modulated output signal. The minimum pulse width can approach zero while having adequate overdrive to the PWM comparator. Having the rising edge of the reset signal rise before the falling edge of the set signal can allow a zero percent duty cycle without the need for a ramp offset voltage.

20 Claims, 8 Drawing Sheets

MINIMUM PULSE WIDTH FOR PULSE WIDTH MODULATION CONTROL

The present invention relates in general to pulse width modulation ("PWM") and, more particularly, to improved minimum pulse widths for a voltage mode controller.

BACKGROUND

Pulse width modulation ("PWM") is a common circuit technique where the width of a pulse in a periodic signal is varied or "modulated" to an extent that depends on the signal needed to control a connected device. PWM is often used to control the supply of electrical power to a device and may be used as a voltage mode controller in power control systems. Using PWM, which switches the power on and off very rapidly, a DC voltage may be efficiently and accurately converted to a lower DC voltage. Through continually adjusting the pulse width, as necessary, the lower DC voltage level can be maintained.

As an example, the pulse from the PWM circuit may be used to control the switch in a DC to DC converter circuit, such as a buck converter in a closed loop voltage mode control system. The width of the PWM pulse determines how long the power from a power source is applied to the converter circuit through the switch. By using an LC filter between the switch and the output, the applied pulsating input is arranged into a relatively smooth DC output voltage and current. Typically, the output voltage and current are then applied to the load with only a small ripple. A PWM power control system may be achieved by using a semiconductor switch where the discrete on/off states of the modulation are used to control the state of the switch which correspondingly controls the voltage across or current through the load. These semiconductor switches may take the form of one or more pass transistors. By using such a configuration, PWM can be used to control the total amount of power delivered to a load. Enhanced accuracy of the voltage level can be obtained and, for portable devices, the battery life is extended since it is applied only in a switched or pulsed manner.

In a conventional circuit using PWM, a ramp signal (Vramp) and a feedback error voltage signal (Verr) are input to a comparator. The Vramp signal may be a sawtooth waveform although it can take other forms. For the feedback error voltage signal Verr, an error amplifier is used to compare the output voltage signal with a reference voltage (e.g., 0.75 volts), to produce the voltage error signal Verr. For example, a sample of the output voltage may be taken and subtracted from a reference voltage to establish a small error signal Verr. This error signal is compared to the ramp signal Vramp. The output of the PWM comparator may then be input to a latch such as an S-R flip flop as the R (reset) input. A periodic clock signal may be the S (set) input. The periodic clock signal may be generated using an internal fixed-frequency system clock generated by a clock circuit, for example. The output of the S-R flip flop may be used as the PWM output signal, or additional processing, such as noise suppression, may be performed. When the circuit output voltage changes, Verr also changes, which causes the comparator threshold to change, and the pulse width of the PWM output signal also changes.

By adjusting the duty cycle of the signal (modulating the width of the pulse), the average power can be varied based on the time fraction that it is "on." Modulation of the duty cycle for a power source will control the amount of power sent to the load. With PWM control, the frequency is held constant while the width of each pulse is varied to form a fixed-frequency, variable-duty cycle operation.

Operating at a higher switching frequency can provide benefits such as improved performance in a closed-loop circuit. Higher switching frequencies may require smaller duty cycles with shorter pulse widths. A conventional PWM signal generation circuit, however, may be limited in how small a pulse width, and duty cycle, can be achieved. As the pulse width decreases, a point is reached where the PWM comparator may not have adequate overdrive to produce a PWM signal below a minimum pulse width. A traditional voltage mode controller may have a minimum pulse width of about 80 nanoseconds.

For a buck converter, the minimum pulse width is the required on-time for a control MOSFET to regulate the output voltage. The on-time ($T_{on}$) is defined by the duty cycle (D) and operating frequency (Fs), where $T_{on}$=D/Fs. Similarly, the duty cycle (D) can be defined as the on-time ($T_{on}$) multiplied by the operating frequency (Fs). For power control applications, the duty cycle may be defined as the output voltage (Vo) divided by the input voltage (Vi), or D=Vo/Vi. For example, where the required voltage for an electrical component is 0.75 volts, and the power supply voltage for the buck converter is 13.2 volts, a duty cycle of 0.075/13.2 or about 5.7% is required. At a frequency of 600 KHz, the required on-time is about 95 nanoseconds. At a frequency Fs of 1.5 MHz, however, the required on-time is about 38 nanoseconds, which is well below the minimum pulse width of about 80 nanoseconds discussed earlier for a conventional voltage mode controller.

In certain cases, a zero percent duty cycle may be desired. For example, soft starting a motor drive (to reduce stresses on the drive components and/or load systems powered by the drive) may require a zero percent duty cycle at start-up, and progressively increasing to larger duty cycles. There may be other situations where programming a zero duty cycle may be desirable. In prior approaches, a diode circuit was often used to add a dc voltage offset to the ramp signal to achieve a zero percent duty cycle. One drawback of using a diode circuit for this purpose is the fact that the diode voltage decreases with temperature. Furthermore, diodes may increase noise and noise susceptibility.

SUMMARY OF THE INVENTION

Briefly and in general terms, the present invention is directed to a circuit for pulse width modulation comprising a comparator configured to receive a control signal and a ramp signal, the comparator capable of generating a reset signal based on the control signal and the ramp signal. The comparator is preferably an operational amplifier having a supply voltage of about 3.3 volts. The PWM circuit may include a clocking circuit for generating a periodic set signal having a rising set edge and a falling set edge. The periodic set signal may have a pulse width of about 25 percent of the period of the switching frequency. A latching circuit is configured to receive the reset signal and the periodic set signal, wherein the latching circuit generates a pulse width modulated signal based on the reset signal and the periodic set signal. The pulse width modulated signal has a rising PWM edge and a falling PWM edge. The ramp signal is preferably a sawtooth waveform that starts to rise before the falling set edge of the periodic set signal and after the rising set edge of the periodic set signal. The ramp signal may also start to rise before the rising PWM edge of the pulse width modulated signal.

The PWM circuit may comprise an oscillator having the periodic set signal and a periodic ramp reset signal as inputs to generate the ramp signal. The periodic ramp reset signal has a rising ramp reset edge and a falling ramp reset edge, where the rising ramp reset edge coincides with the rising set edge, and the falling ramp reset edge occurs before the falling set edge. The falling ramp reset edge of the periodic ramp reset signal causes the ramp signal to rise, and the rising set edge of the periodic set signal causes the ramp signal to fall. By way of example, the falling ramp reset edge may occur halfway between the rising set edge and falling set edge of the periodic set signal, which would cause the ramp signal to start to rise midway between the falling set edge and the rising set edge of the periodic set signal. For a periodic set signal having a pulse width of about 25 percent of the period of the switching frequency, such a ramp signal would rise at about 12.5 percent of the period of the switching frequency. Other timing schemes, of course, may be used.

In another aspect, the control signal is a feedback voltage error signal. To produce a zero percent duty cycle, the reset signal rises before the periodic set signal falls. This allows a voltage error feedback amplifier to command a zero percent duty cycle without the need for a dc offset for the PWM ramp signal. For other duty cycles, the feedback voltage error signal intersects the ramp signal at a relatively linear region of the ramp signal.

A method for pulse width modulation may include the steps of generating a ramp signal, comparing the ramp signal to a control signal to generate a reset signal having a reset rising edge and a reset falling edge, generating a periodic set signal having a rising edge and a falling edge, and latching the reset signal and the periodic set signal to produce a pulse width modulated signal having a PWM rising edge, a PWM falling edge, a PWM switching frequency. The control signal that is compared with the ramp signal is preferably a feedback voltage error signal that intersects the ramp signal at a relatively linear region of the ramp signal. The ramp signal preferably starts to rise before the falling edge of the periodic set signal and after the rising edge of the periodic set signal, as well as before the rising PWM edge of the pulse width modulated signal. To produce a zero percent duty cycle, the reset signal rises before the periodic set signal falls. The step of generating the periodic set signal may include using an internal clock configured to operate at quadruple the switching frequency of the pulse width modulation signal, and the periodic set signal may have a pulse width of about 25 percent of the period of the PWM switching frequency. The minimum pulse width of the PWM output signal can approach close to zero while still providing adequate overdrive to the PWM comparator. Accordingly, a power converter can operate at a higher frequency, such as 4 MHz, where a small pulse width in the low nanosecond range may be required.

The features and advantages of the invention will be more readily understood from the following detailed description which should be read in conjunction with the accompanying drawings.

DETAILED DESCRIPTION OF THE PREFERRED EMBODIMENTS

In the following description of the preferred embodiment, reference is made to the exemplary drawings for purposes of illustrating specific embodiments of the invention, wherein like reference numerals designate corresponding or like elements among the several views. Embodiments of the invention will be described with respect to voltage mode controllers, and it is to be understood that the invention is not limited to the specific embodiments described and illustrated herein.

Figure 1:
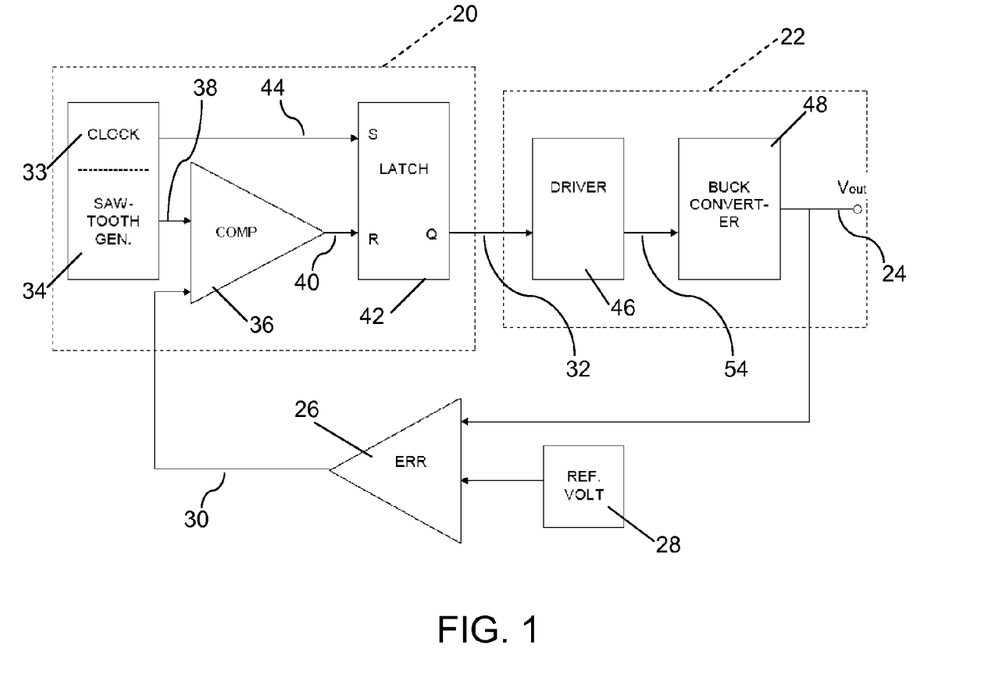
FIG. 1 is a block diagram of an embodiment of a pulse width modulator circuit for a voltage mode controller used to drive a buck converter with which an input voltage is reduced to an output voltage Vout.

FIG. 1 illustrates a block diagram of a pulse width modulation (PWM) circuit 20. The PWM circuit 20 controls a power converter 22, the voltage output 24 or Vout of which is compared to a voltage reference 28 by a feedback voltage error comparator 26. The feedback signal 30 resulting from this comparison is supplied to the PWM circuit 20 for use as a feedback error control in adjusting the control pulse 32 provided to the driver circuit 46 of the power converter 22. The feedback signal may also be referred to as an error control signal or a comp control signal.

The PWM circuit 20 further includes a clock circuit 33 and ramp waveform generator 34, such as a sawtooth-type waveform generator. The clock circuit 33 is shown as a single device for purposes of this simplified schematic, although the clock circuit may take any of the many forms known to those of ordinary skill in the art, including separate devices for the clock and waveform generator. A PWM comparator 36 receives a ramp signal 38 from the generator 34, as well as the error signal 30 from the feedback comparator 26, and provides a reset pulse 40 to a latch circuit 42. The clock circuit 33 provides a set signal 44 to the latch. Based on these inputs, the latch 42 provides the PWM control pulse 32 to the driver 46. The converter 22 may include a buck converter 48 receiving a drive signal 54 from the driver 46. The voltage output Vout 24 can be used to generate the voltage feedback error signal for closed loop voltage mode control. The feedback comparator 26 may be an operational amplifier.

Figure 2:
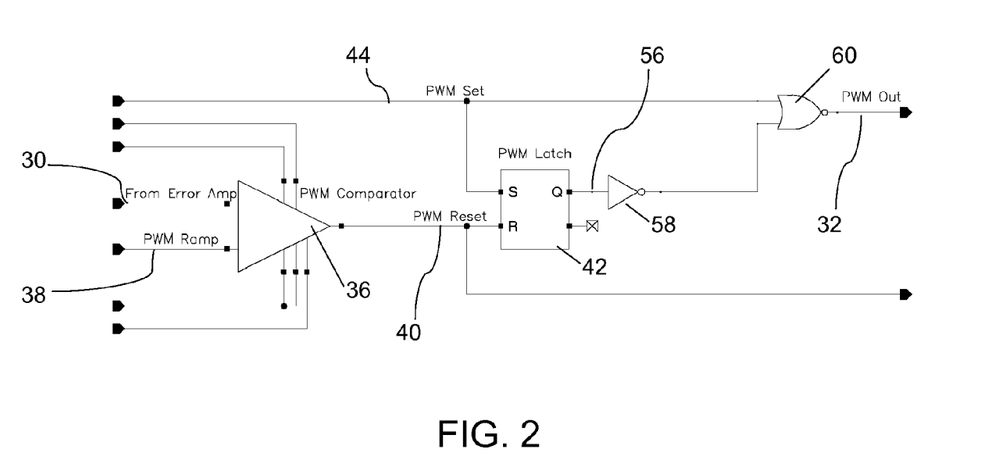
FIG. 2 is a more detailed view of a pulse width modulator circuit in accordance with aspects of the present invention showing an example of usable device types and inter-connections along with input and output connection signal lines.

Turning now to FIG. 2, an example of an implementation of the PWM circuit 20 is provided although one of ordinary skill in the art will recognize that other circuit designs may be used. A PWM comparator 36 is configured to receive the error signal 30 at its EAOut pin and the PWM ramp signal 38 at its IRT pin and to provide a PWM reset signal 40 at its OUT pin to the "r" input of the latch 42. Other inputs are provided to the PWM comparator as shown. The PWM comparator 36 is preferably an operational amplifier having a supply voltage of 3.3 volts. The S-R latch receives a PWM set signal 44 at its "s" input and provides a latch output signal 56 at its "Q" output. The latch output signal 56 is inverted by an inverter or NOT gate 58, and is then provided to a NOR gate 60 along with the set signal 44. The output of NOR gate 60 provides the PWM output control pulse 32. The driver 46 (see FIG. 1) may receive the PWM output control pulse 32.

At higher switching frequencies, the minimum pulse width is influenced by the speed of PWM comparator 36. Propagation delays through the comparator may limit how small a duty cycle can be achieved. Where the overdrive of the PWM comparator is not sufficient, a low potential difference between the error signal and the valley of the ramp signal places increased strain on the comparator to differentiate these values. If adequate overdrive is not present, the propagation delay will increase and pulses can be lost. The rising and falling edges of the reset signal from the comparator may become muddled with noise and distortion. At some point, this sluggish response may cause such a deterioration in the generation of the reset signal that the PWM output signal will fall below the minimum pulse width for the circuit, and output remains in the low state (i.e., no pulse). Such pulse skipping may adversely affect the PWM control scheme.

Figure 3:
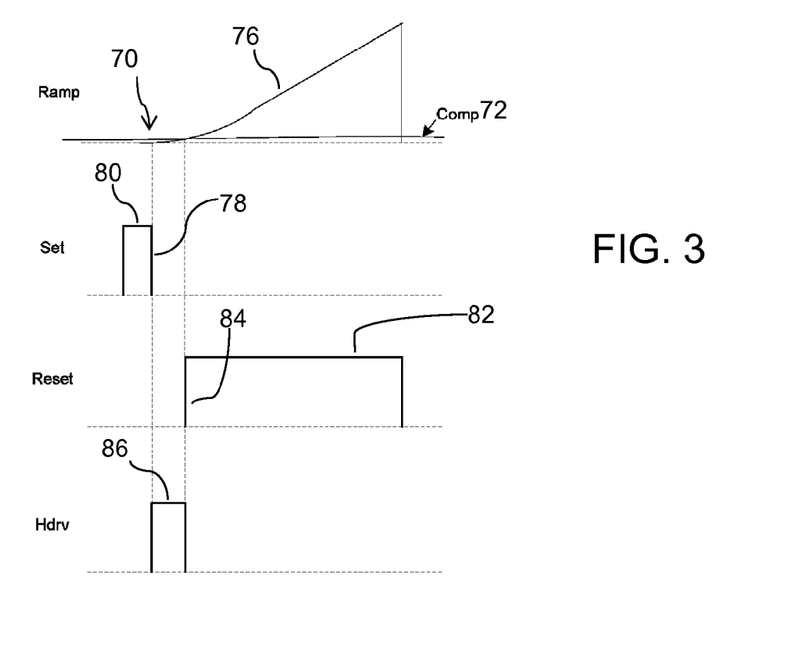
FIG. 3 shows a set of four aligned timing diagrams of a pulse width modulator circuit in which the falling edge of a SET signal controls the beginning of the ramp signal input to a comparator, with the RESET signal to the comparator controlling the pulse width of the PWM output signal Hdrv.
Figure 4:
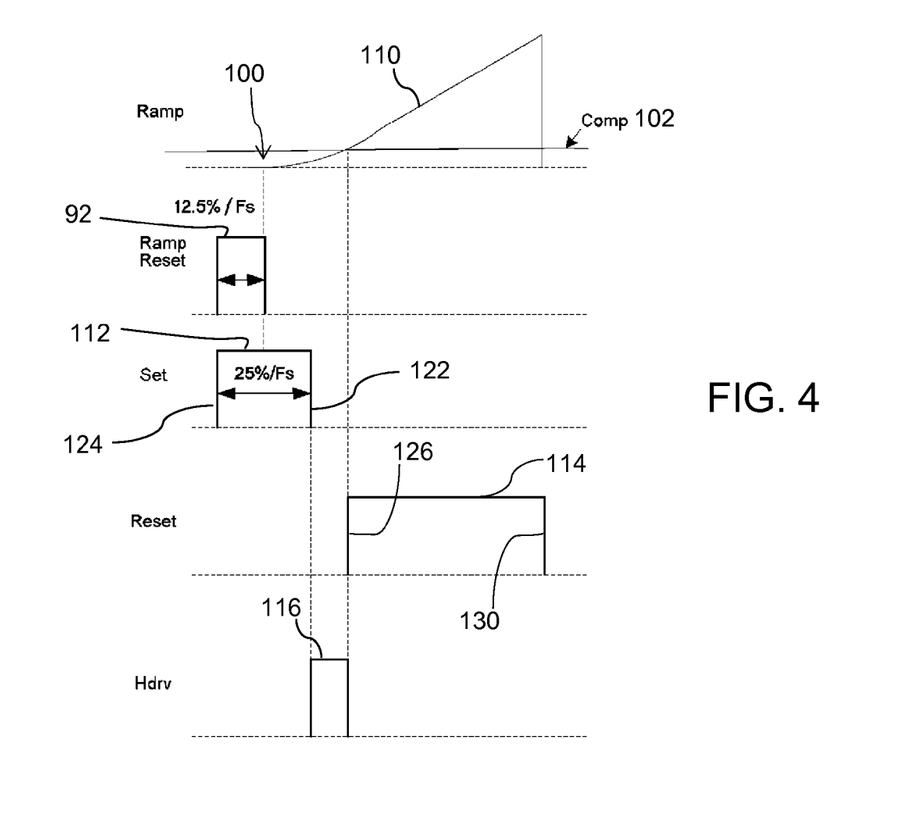
FIG. 4 provides a set of five timing diagrams similar to those of FIG. 3 showing that, in accordance with aspects of the invention, the SET signal width is selected in accordance with the switching frequency, and the ramp signal is controlled by a ramp reset signal and the SET signal to begin rising at a point between the rising edge of the SET signal and the falling edge of the SET signal.

Moving now to FIGS. 3 and 4, a series of timing diagrams are shown that illustrate a comparison of different PWM techniques. FIG. 3 illustrates a technique where the falling edge 78 of the set signal 80 causes the latch to set to an "on" mode and generate a rising edge for the high PWM output signal 86 or Hdrv signal. The ramp signal 76 starts upward at the rise point 70 triggered by the falling edge 78 of the set signal 80.

An intersective method may be used to generate the reset signal 82. The error or comp control signal 72 is compared to the sawtooth-type waveform of the ramp signal 76 to produce the reset signal 82. The rising edge 84 of the reset signal 82 is generated when the rising ramp signal 76 intersects the comp control signal 72. The ramp signal 76 falls with the rising edge of the set signal 80, and the intersection of the falling ramp signal 76 with the comp control signal 72 causes the reset signal 82 to fall and go low as well.

The leading edge 84 of the reset signal 82 causes the latch to reset to an "off" mode, which causes the Hdrv signal, also referred to as the PWM output signal 86, to go low to form a falling pulse edge. Thus, the rising edge of the Hdrv or PWM output signal 86 occurs with the falling set edge 78 of the periodic set signal 80, and the falling edge of the Hdrv or PWM output signal 86 occurs with the rising reset edge 84 of the reset signal 82. The resulting PWM output signal 86 or Hdrv signal may be used to control or drive a converter (such as the converter 22 illustrated in FIG. 1).

FIG. 4 illustrates the rise of the ramp signal 110 beginning earlier than at the falling edge 122 of the set signal 112. The ramp signal 110 begins its rise after the leading edge 124 of the set signal 112 and before the falling edge 122 of the set signal 112. By the time the falling edge 122 of the set signal 112 occurs, the ramp signal 110 preferably has attained a voltage level along a substantially linear portion of the ramp signal. This provides a more stable region for the PWM comparator to generate the reset signal 114 based on the intersection of the error or comp control signal 102 with the more linear portion of the ramp signal 110. This more linear region of the ramp signal 110 has a larger slope than the bottom soft portion at the beginning of the ramp signal rise. For sawtooth-type ramp generators, the beginning or bottom of the ramp signal 110 may include a "soft" portion at which the voltage is non-linear and where the slope of the ramp signal is often smallest. While this may not pose a problem with longer duty cycle applications, or with slower switching speeds, it can cause difficulties at higher frequencies requiring shorter duty cycles with smaller pulse widths. For a comparator working at this soft bottom portion of the ramp signal 110, there may not be adequate overdrive for the comparator to properly perform. In cases involving small pulse widths in the low nanosecond range, the difference between the comparative error signal voltage and the ramp signal voltage may only be slight since the ramp signal 110 at or near the soft bottom area of its waveform may not meet the overdrive specification for the comparator at the switching speed of operation. This can create instability in the control loop, and may result in pulse jitter, larger ripple voltages, and subharmonic conditions where pulse cycles may be skipped.

As shown in FIG. 4, the rise point 100 of the ramp signal 110 has been moved to begin earlier, between the rising 124 and falling 122 edges of the set signal 112. The rise point 100 of the ramp signal 110 preferably begins midway between the rising and falling edges of the set signal 112, but the rise point may begin at another point between the rising and falling edges in other embodiments. This rise point is preferable selected so that a substantially linear portion of the ramp signal 110 exists at or near the falling set edge 122 of the set signal 112. The comp control signal 102 intersects a substantially linear portion of the sawtooth ramp signal 110 which preferably has a greater slope than the nonlinear region at the bottom of the ramp signal 110. The pulse width of the Hdrv or PWM output signal 116 may span a substantially linear region of the ramp signal 110. The rising edge of the Hdrv or PWM output signal 116 occurs with the falling set edge 122 of the periodic set signal 112, and the falling edge of the Hdrv or PWM output signal 116 occurs with the rising reset edge 126 of the reset signal 114.

The width of the set signal 112 of FIG. 4 may also be modified in accordance with the switching speed of the PWM circuit. In the embodiment shown, the pulse width of the set signal 112 is selected to be 25% of the period of the switching frequency. The width of the set pulse signal may differ depending on the maximum desired duty cycle for the application. For a set signal having a pulse width that is 25% of the period of the switching frequency, the maximum duty cycle would be 75%.

The pulse width of the set signal 112 is preferably long enough to provide enough time for the ramp signal 110 to reach a substantially linear area of its waveform when the falling edge 122 of the set signal 112 occurs. The periodic set signal 112 and ramp reset signal 92 may be generated using a quadruple speed internal clock. As previously discussed, this would result in a periodic set signal 112 having a pulse width that is 25% of the period of the switching frequency. The rise point 100 of the ramp signal 110 preferably begins midway between the rising and falling edges of the set signal, which, as illustrated in FIG. 4, results in the ramp signal 110 having a rise point 100 beginning at 12.5% of the period of the switching frequency before the falling edge 122 of the set signal 112 (which, being the midpoint of the set signal, would also correspond to having a rise point beginning at 12.5% of the period of the switching frequency after the rising edge of the set signal). For a 1 MHz switching frequency, this would result in a set signal having a pulse width of two-hundred-fifty nanoseconds, where the rise point of the ramp signal starts one-hundred-twenty-five nanoseconds after the rising edge of the set signal. It is to be understood that other timing schemes may also be implemented.

One way to achieve the desired timing of the periodic set signal and sawtooth ramp signal illustrated in FIG. 4 is to configure the clock 33 and the sawtooth generator 34 shown in FIG. 1 to cooperate such that the rise point 100 of the ramp signal 110 is located between the rising and falling edges of the set signal 112. Further, the pulse width of the set signal 112 preferably accommodates the occurrence of the rise point 100 and the nonlinear bottom section of the ramp signal 110 prior to the falling edge 122 of the set signal 112, as shown in FIG. 4. For the signal timing illustrated in FIG. 3, the sawtooth generator or oscillator is synchronized with the clock so that the rise of the ramp signal 76 starts at the falling edge of the set signal 80, and the falling edge of the ramp signal is synchronized with the rising edge of the set signal.

To achieve the signal timing illustrated in FIG. 4, an oscillator running at some multiple of the switching frequency can be used to generate the set and ramp reset signals 112 and 92. The ramp reset signal 92 controls the ramp signal 110 directly. When the ramp reset signal 92 is high the ramp signal 110 is reset to zero, and when the ramp reset signal 92 is low the ramp signal 110 is allowed to rise. The ramp reset signal 92 is illustrated as having half the pulse width of the clocked set signal 112, and the rising edge of the ramp reset signal 92 coincides with the rising edge 124 of the clocked set signal 112. The falling edge of the ramp reset signal would occur about one-hundred-twenty-five nanoseconds after the rising edge of a 250-nanosecond-length set signal in a 1 MHz embodiment having a clock set at quadruple the switching frequency. The falling edge of the ramp reset signal 92 causes the rise of the ramp signal 110 before the falling edge 122 of the set signal 112 occurs. If desired, the falling edge of the ramp reset signal could occur at points other than the midpoint of the pulse width of the set signal. Other embodiments of relative signal control and timing may also be used.

The comp control signal 102 of FIG. 4 intersects the ramp further from the rise point than the comp control signal 72 of FIG. 3. This is a result of the shifted set signal 112 and ramp signal 110 using the PWM technique of FIG. 4. As previously discussed, the comp signal 102 is a feedback signal from an error amplifier having the output voltage of a power converter as an input.

Figure 5:
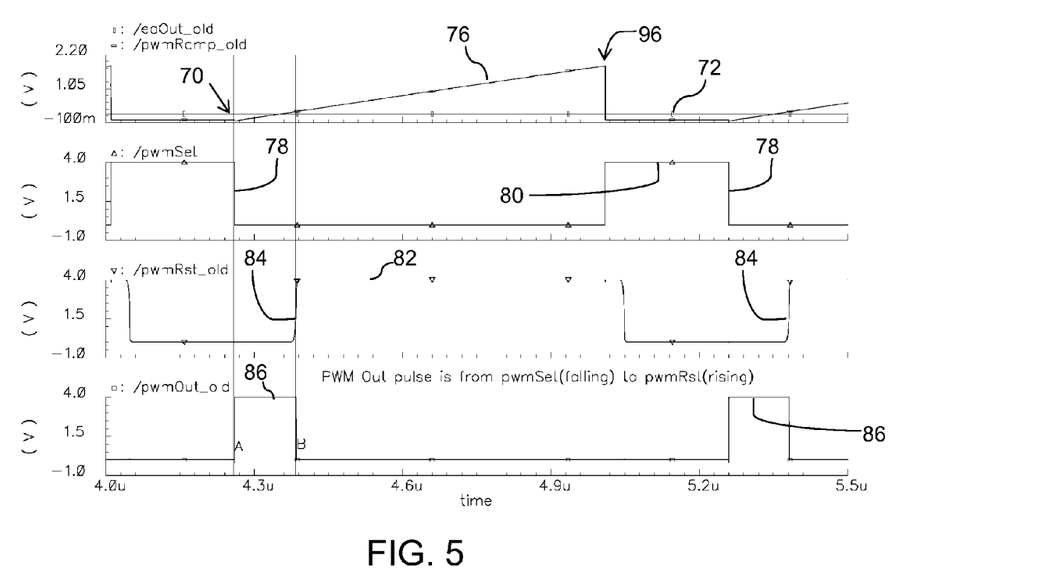
FIG. 5 shows four signal timing graphs of a prior art system and method for generating a PWM signal showing events occurring in the time frame of 4.0 microseconds to 5.5 microseconds for the ramp signal, the set signal, the reset signal, and the output PWM signal.
Figure 6:
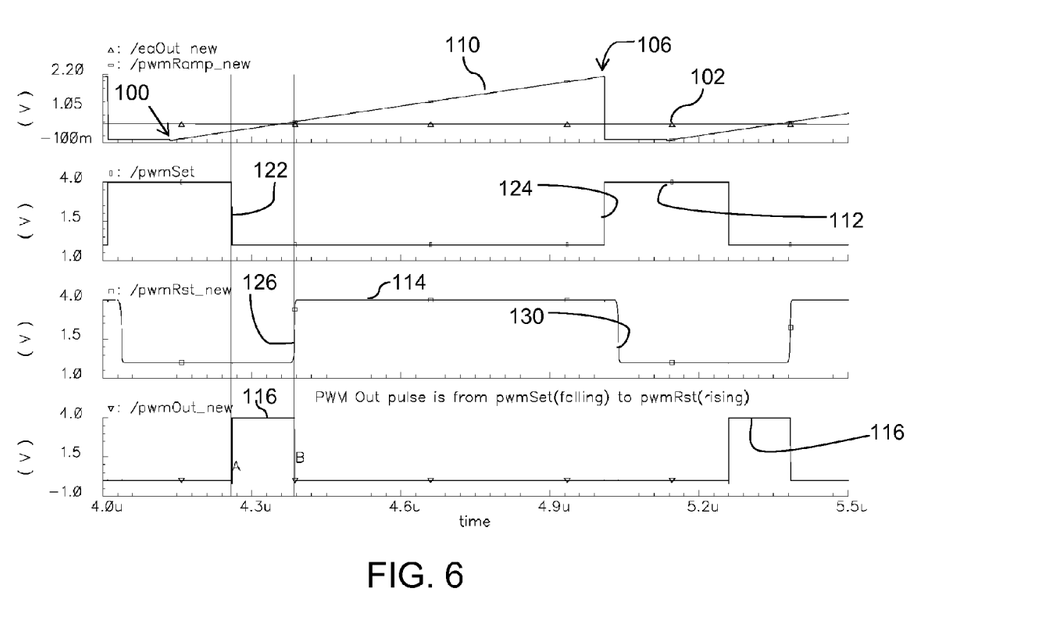
FIG. 6 presents four timing graphs for the ramp signal, the set signal, the reset signal, and the output PWM signal aligned with those of FIG. 5 for ease in comparison, showing the different ramp signal and generation of the PWM signal in accordance with aspects of the present invention in the time frame of 4.0 microseconds to 5.5 microseconds.

Turning now to FIGS. 5 and 6, there are shown four signal timing graphs of a PWM signal generated in accordance with the techniques illustrated in FIGS. 3 and 4, respectively. The signal timing graphs of FIG. 5 illustrates events occurring in the time frame of 4.0 microseconds to 5.5 microseconds for the ramp signal 76 (top graph), the set signal 80 (second from top graph), the reset signal 82 (third from top graph), and the output PWM signal 86 (bottom graph). The pulse width of the PWM output signal 86 is decreased over time in this example (which results in a decreasing duty cycle), until the minimum pulse width of the PWM signal is achieved for that approach or technique. To decrease the PWM output signal over time, the error control signal (72 in FIG. 5, and 102 in FIG. 6) is forced lower over time, which causes the reset signal (82 in FIG. 5, and 114 in FIG. 6) to rise sooner, which, in turn, forces the PWM output signal (86 in FIG. 5, and 116 in FIG. 6) to go low sooner. The minimum pulse width supportable is eventually reached. For the technique illustrated in FIG. 3, the minimum pulse width is reached after about thirty microseconds. For the PWM technique illustrated in FIG. 4, a much smaller minimum pulse width is reached within about sixty microseconds.

As illustrated in FIG. 5, the rise point 70 the ramp signal 76 occurs with the falling edge 78 of the set signal, and results in the ramp signal 76 having a final amplitude 96. While the rise of the ramp signal 76 is synchronized with the falling edge 78 of the set signal 80, the falling edge of the ramp signal is synchronized with the rising edge of the set signal. The PWM output pulse 86 is generated between the falling edge 78 of the set signal 80 and the rising edge 84 of the reset signal 82. As illustrated in FIG. 5, the width of PWM output pulse 86 (measured between points A and B) is about one-hundred-twenty-five nanoseconds. There is sufficient overdrive for the PWM comparator to produce a sharp enough reset signal for a PWM output signal having a pulse width of about one-hundred-twenty-five nanoseconds.

FIG. 6 also presents four signal timing graphs in accordance with FIG. 4 for generating a PWM signal, the events illustrated in FIG. 6 are occurring in the same time frame of 4.0 microseconds to 5.5 microseconds as in FIG. 5 for purposes of comparison. The ramp signal 110 (top graph), the set signal 112 (second from top graph), the reset signal 114 (third from top graph), and the output PWM signal 116 (bottom graph) are shown. In this PWM technique, the nonlinear portion of the ramp signal 110 is located before the falling edge 122 of the set signal 112 while the ramp signal 110 is in the linear portion for the remainder of its time. The comp control signal 102 from an error feedback amplifier intersects a more substantially linear region of the ramp signal 110. A larger ramp amplitude 106, compared to the ramp amplitude 96, is also a result of the earlier rise point 100 of the ramp signal 110 shown in FIG. 6 over the later rise point 70 of the ramp signal 76 shown in FIG. 5, which increases length of time for the substantially linear slope of the ramp signal to rise. The sawtooth wave of ramp signal 110 falls with the rising edge of set signal 112, which causes the reset signal 114 to fall when the ramp signal 110 intersects the comp control signal 102.

The PWM output pulse 116 is generated between from the falling edge 122 of the set signal 112 to the rising edge 126 of the reset signal 114. The PWM output pulse 116 has a pulse width of about one-hundred-twenty-five nanoseconds, similar to that illustrated in FIG. 5 discussed earlier. As with the technique of FIG. 5 discussed earlier, there is sufficient overdrive for the PWM comparator using the FIG. 4 technique to produce a sharp reset signal for a PWM output signal having a pulse width of about one-hundred-twenty-five nanoseconds, as measured between points A and B in FIG. 6.

As used herein, the term "overdrive" may refer to the voltage difference between the applied input voltage and the reference that is required for switching within a given time. The propagation delay between the time it takes for the comparator to compare two signals at its input, and for its output to reach the midpoint between the two output logic levels is equal to or less than the period corresponding to the switching frequency.

Figure 7:
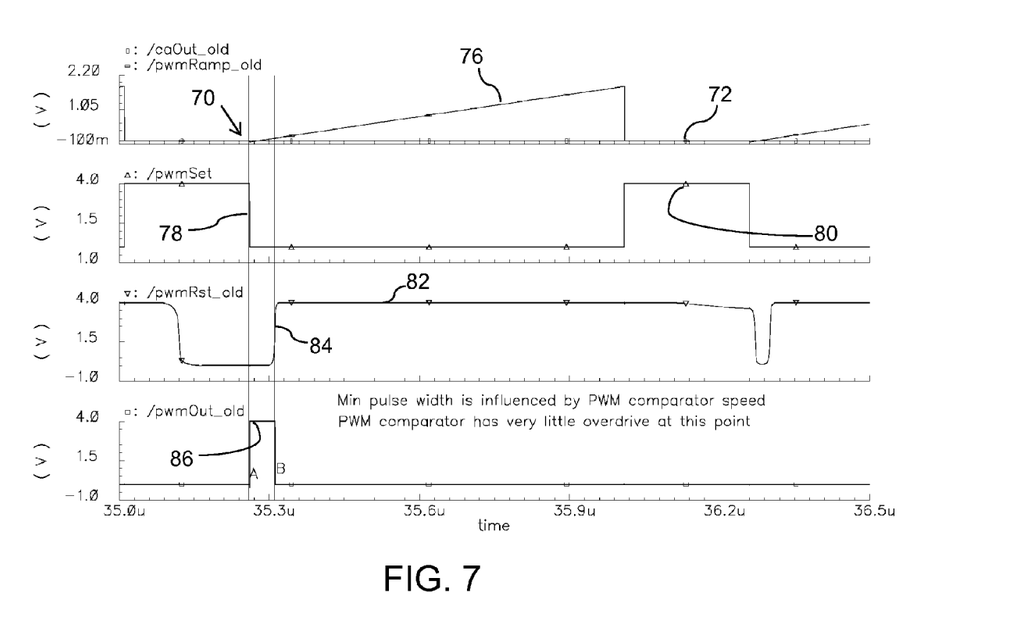
FIG. 7 provides another set of four timing graphs for the ramp signal, the set signal, the reset signal, and the output PWM signal similar to those of FIG. 6 but in this case for the time period of 35.0 microseconds through 36.5 microseconds showing deterioration of the reset signal resulting in a complete absence of an output PWM signal after about thirty-six microseconds.

Moving on to the timing diagrams illustrated in FIG. 7, the effect of a lack of overdrive from the PWM comparator in the technique of FIGS. 3 and 5 can be seen at the time frame of 35.0 through 36.5 microseconds. In particular, the falling edge of the reset signal 82 is lagging and is not sharp. At around the thirty-six microsecond mark, no PWM output signal is formed. The minimum pulse width here using the FIG. 3 technique is about fifty nanoseconds. The PWM comparator has very little overdrive at this point, and smaller pulse widths are not attained. Furthermore, jitter or pulse skipping may occur for duty cycles in this range. The difference in the voltages between the feedback error or comp control signal 72 and the ramp signal 76 may not provide sufficient overdrive for the PWM comparator, especially for short duty cycles with pulse widths in the low or sub nanosecond range. The minimum pulse width is influenced by the PWM comparator speed. The propagation speed of the comparator may not be able to keep up with such short duty cycles for the PWM output signal 86.

Figure 8:
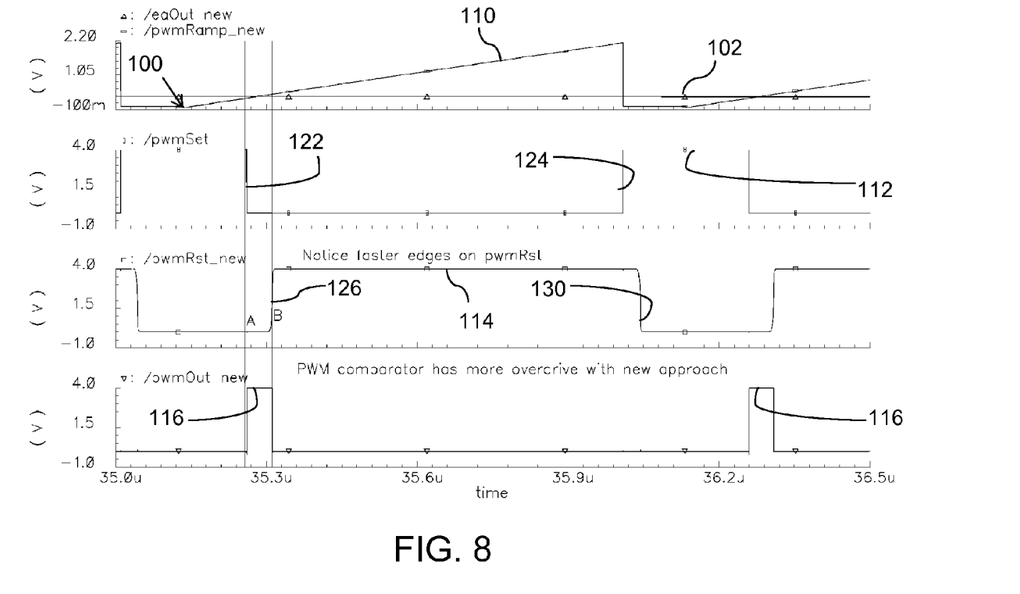
FIG. 8 presents four timing graphs for the ramp signal, the set signal, the reset signal, and the output PWM signal aligned with those of FIG. 7 for ease in comparison, also for the time period of 35.0 microseconds through 36.5 microseconds showing the accurate generation of a narrower PWM output signal with progressively smaller pulse widths.

The timing diagrams of FIG. 8 employs the PWM technique illustrated in FIG. 4 and follows the timing diagrams of FIG. 6 within the time frame of 35.0 through 36.5 microseconds. Even at a pulse width of about fifty nanoseconds, the PWM comparator has more overdrive with this PWM technique, as illustrated in FIG. 8, compared to the results achieved with the technique illustrated in FIG. 7. The comp control signal 102 continues to intersect a substantially linear region of the sawtooth ramp signal 110, as a result of the earlier rise point for the ramp signal 110. Faster rising and falling edges 126 and 130 for the reset signal 114 are achieved. As illustrated in FIG. 8, the PWM output signal 116 is able to attain a smaller minimum duty cycle with the PWM technique shown in FIG. 4.

Figure 9:
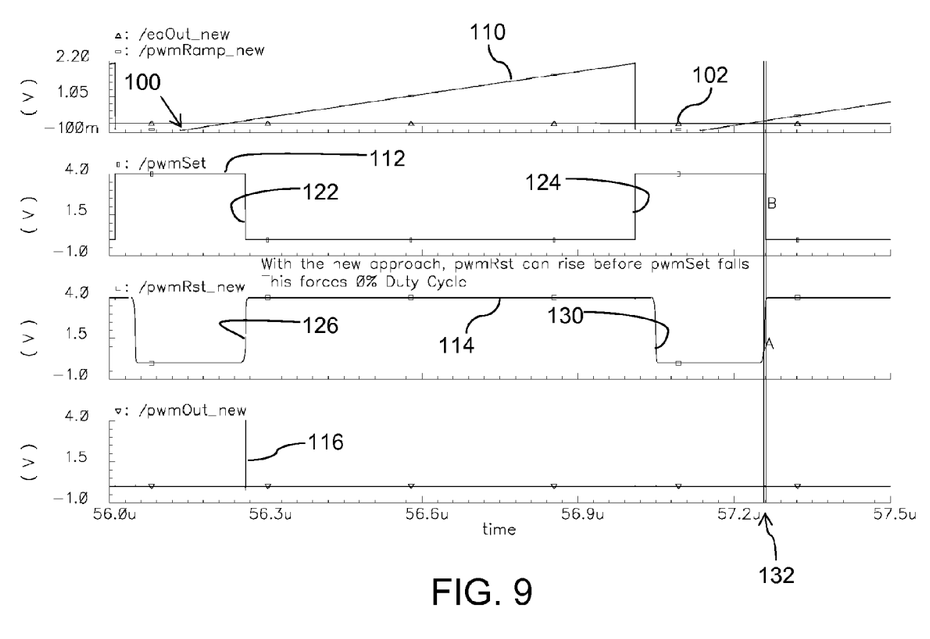
FIG. 9 provides a set of timing graphs of the ramp signal, set signal, reset signal, and PWM output signal for the time period of 56.0 microseconds through 57.5 microseconds, where the generated PWM output signal has a very narrow pulse width at about 56 microseconds and then an intended zero percent (0%) duty cycle at about fifty-seven microseconds.

Proceeding to FIG. 9, timing diagrams extending the approach of FIG. 8 out to the time period of 56.0 to 57.5 microseconds is presented. The four timing graphs for the ramp signal 110, the set signal 112, the reset signal 114, and the output PWM signal 116 are illustrated. The first PWM signal 116 has a very narrow pulse width that is close to zero nanoseconds. The minimum pulse width for the output PWM signal can be allowed to approach zero while providing adequate overdrive to the PWM comparator. At point 132, which occurs shortly after the fifty-seven microsecond mark, the output PWM signal has an intended zero percent (0%) duty cycle. Having the rising edge of the reset signal 114 rise before the falling edge of the set signal 112, allows the error feedback amplifier to command a zero percent duty cycle without the need for a DC PWM ramp offset voltage. Eliminating the need for a diode circuit to produce this offset voltage allows one to generate a virtual ramp offset that does not vary with temperature and improve PWM circuit performance.

Figure 10:
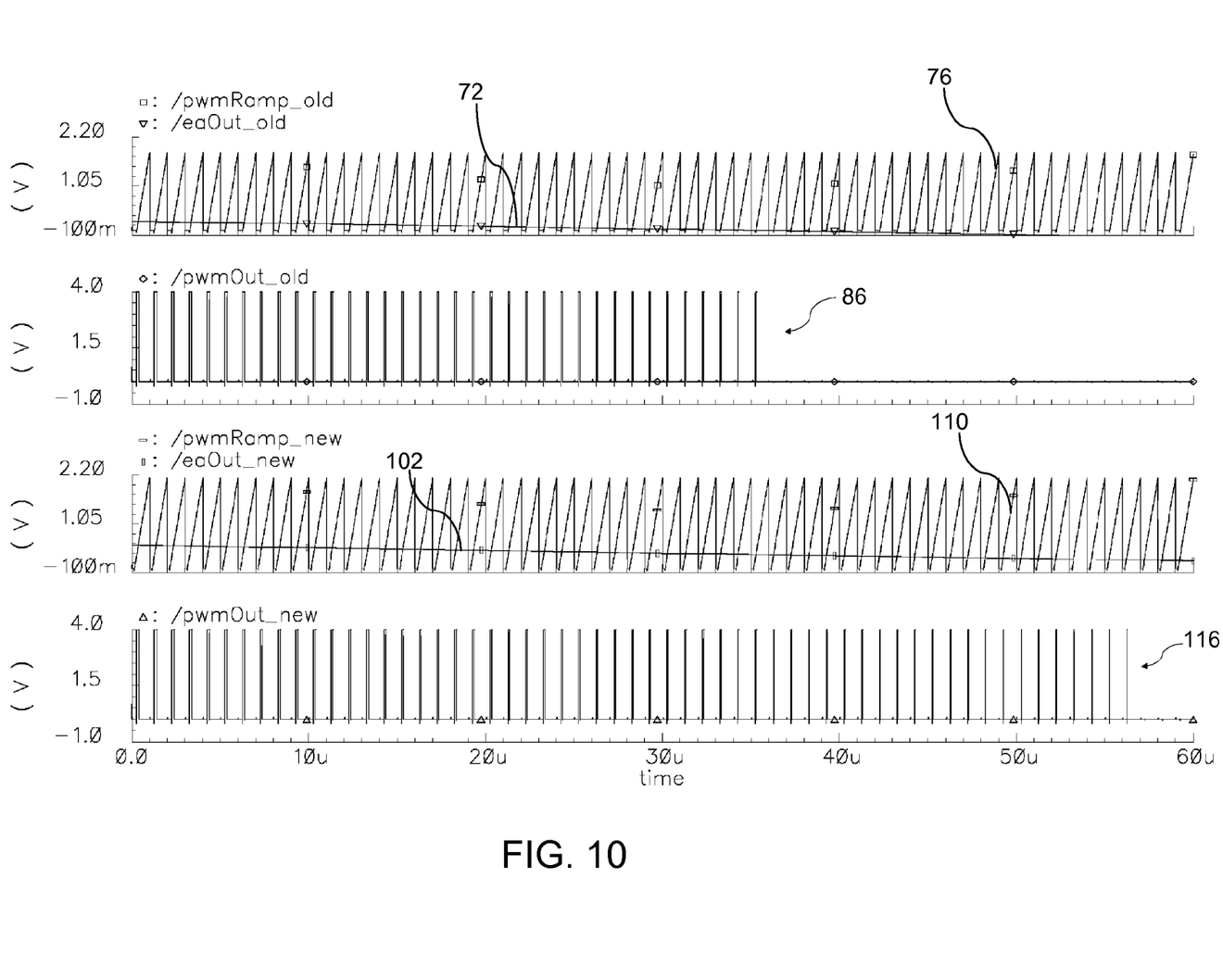
FIG. 10 provides a set of timing graphs of two pulse width modulated systems at a switching frequency of 1 MHz during the time period of 0.0 microseconds to 60.0 microseconds, with the two top graphs showing a prior art PWM system which is unable to output any PWM signals after approximately 35 microseconds, and wherein the bottom two graphs show a system in accordance with aspects of the invention that provides ever narrower PWM output signals culminating in an intended zero percent duty cycle pulse starting at about fifty-seven microseconds.

FIG. 10 provides a set of timing graphs of two PWM systems operating at a switching frequency of 1 MHz during the time period of 0.0 microseconds to 60.0 microseconds. As in the previous timing diagrams, the duty cycle of the PWM output signal is decreased over time to produce smaller pulse widths. The comparative error signal is forced lower over time, which causes the reset signal to rise earlier, which, in turn, forces the PWM output signal to go low earlier. The comp control signal 72 following the FIG. 3 technique falls below the bottom of the ramp signal 76 after about fifty microseconds. The comp control signal 102 following the PWM technique of FIG. 4 remains above the bottom of the ramp signal 110 up to the end of the sixty microsecond time period. The comp control signal 102 following the FIG. 4 technique also has a higher voltage than the comp control signal 72 following the FIG. 3 technique, which is a result of the shifted set signal and ramp signal of the FIG. 4 technique for PWM.

As illustrated in FIG. 10, the two top graphs showing the PWM system of FIG. 3 does not output a PWM signal after approximately thirty-five microseconds. The bottom two graphs show a system in accordance with FIG. 4 that provides ever narrower PWM output signals, which culminates in an intended zero percent duty cycle pulse at near sixty microseconds. Thus, the minimum pulse width is reached in about thirty microseconds as illustrated the pwmOut_old graph (second graph from the top), and a much smaller minimum pulse width is reached within about sixty microseconds as illustrated the pwmOut_new graph (bottom graph) of FIG. 10.

Figure 11:
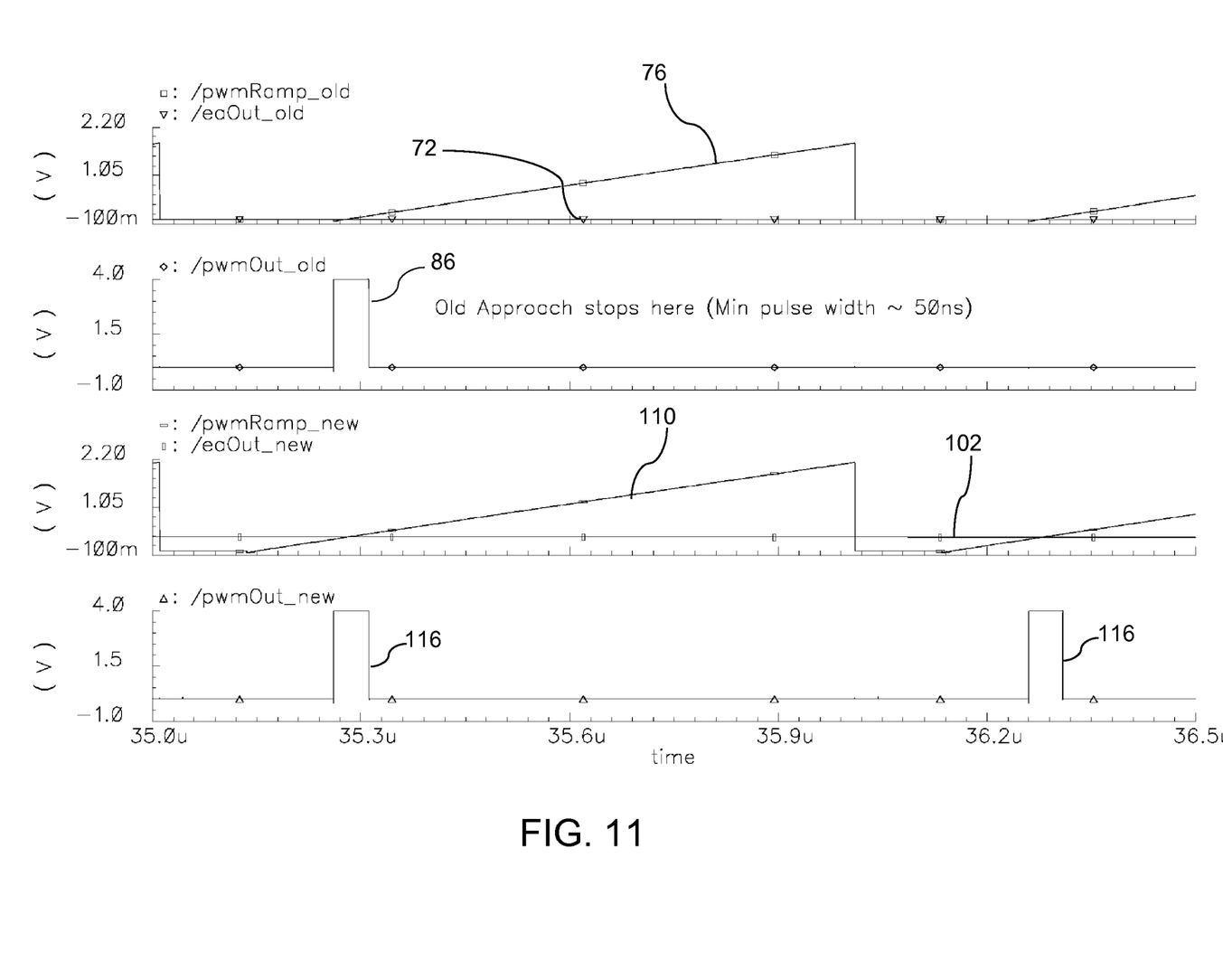
FIG. 11 provides the graphed voltages as in FIG. 10 for the time period of 35.0 microseconds through 36.5 microseconds showing the a minimum pulse width of about fifty nanoseconds for the top two graphs, while the a PWM output signal is still being shown in the bottom two graphs.

FIG. 11 provides an enlarged set of four timing diagrams at a switching frequency of 1 MHz within the time period of 35.0 microseconds to 36.5 microseconds from FIG. 10, with the upper two graphs following the FIG. 3 technique, and the bottom two graphs following the FIG. 4 technique are aligned with the upper two graphs for ease of comparison. These enlarged graphs also show the difference in the voltages between the FIG. 3 technique (see top two graphs) and the FIG. 4 technique (see bottom two graphs). The intersection of control signal 72 and ramp signal 76 illustrated in the top two graphs of FIG. 11 occurs near the bottom of the sawtooth ramp signal where the slope is smallest. The intersection of control signal 102 and ramp signal 110 illustrated in the bottom two graphs of FIG. 11 occurs in a more linear portion of the sawtooth ramp signal where the slope is larger.

The overdrive for the PWM comparator degrades and becomes inadequate near the thirty-six microsecond mark in the top graphs of FIG. 11 illustrating the FIG. 3 technique. This represents a minimum pulse width of about fifty nanoseconds, which is consistent with the timing diagrams illustrated in FIG. 7. However, the circuit response shown in the bottom two graphs of FIG. 11 illustrating the FIG. 4 technique continues to have enough overdrive for the PWM comparator to produce minimum pulse widths that are less than fifty nanoseconds. This is consistent with the timing diagrams illustrated in FIG. 8.

Figure 12:
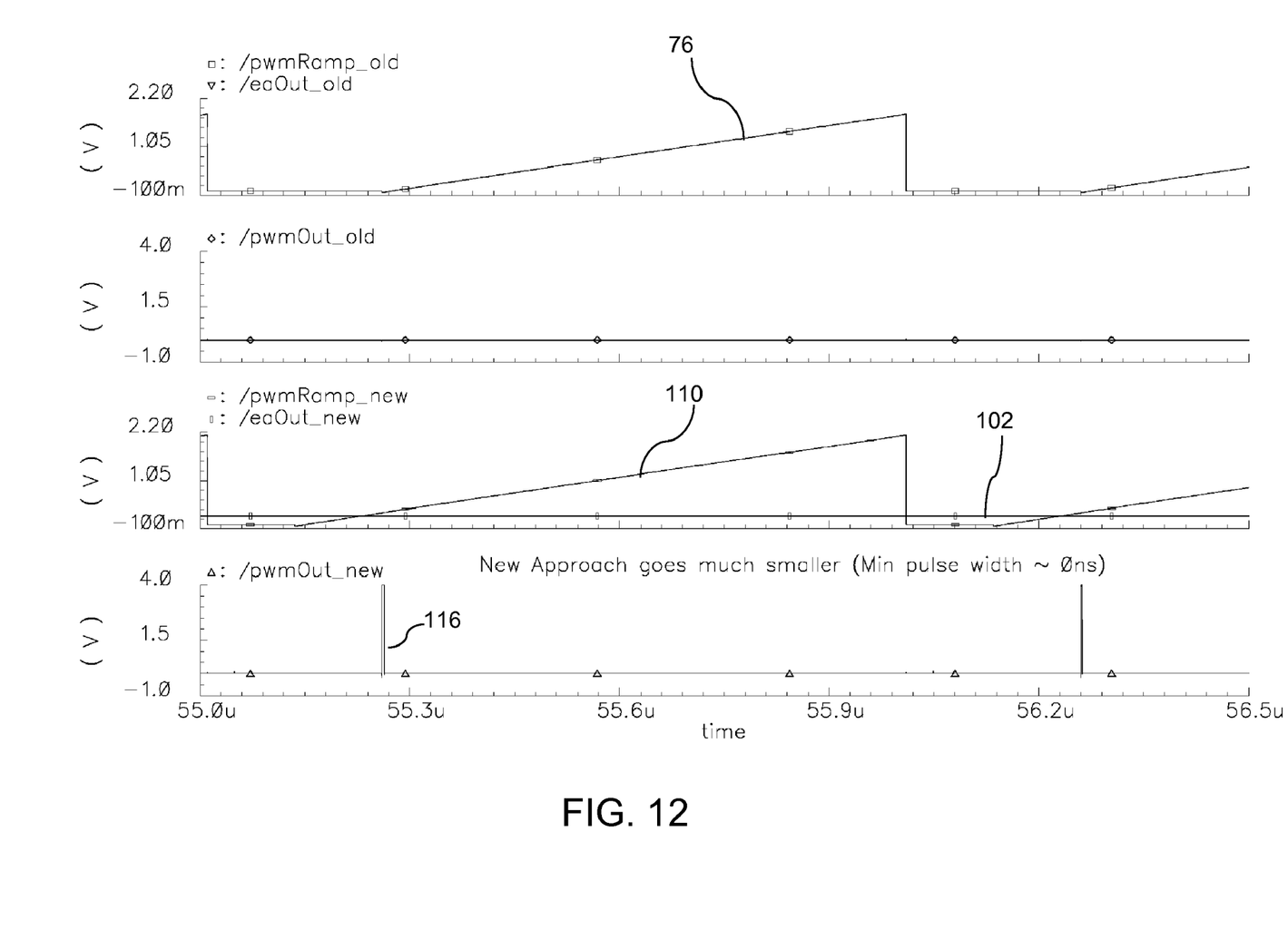
FIG. 12 provides the graphed voltages as FIG. 10 for the time period of 55.0 microseconds through 56.5 microseconds showing no PWM output signal for the top two graphs, and a progressively narrower duty cycle leading to a zero percent duty cycle in the bottom two graphs.

FIG. 12 provides an enlarged set of four timing diagrams at a switching frequency of 1 MHz within the time period of 55.0 microseconds to 56.5 microseconds from FIG. 10. Similar to FIG. 11, the upper two graphs follow the FIG. 3 technique, and the bottom two graphs following the FIG. 4 technique are aligned with the upper two graphs for comparison purposes. At this point, after the fifty-five microsecond mark, the comp control signal is nonexistent, and there is no PWM output signal, as this is well past the minimum pulse width achievable using the FIG. 3 technique. On the other hand, minimum pulse widths approaching zero nanoseconds for the PWM output signal 116 are achievable using the FIG. 4 technique, as illustrated by the bottom two graphs of FIG. 11. The comp control signal 102 continues to intersect a relatively linear portion of the sawtooth ramp signal 110. The circuit response shown in the bottom two graphs continues to show enough overdrive for the PWM comparator to provide complete control over the duty cycle for minimum pulse widths to a zero duty cycle. This is consistent with the timing diagrams illustrated in FIG. 9. Even though these graphs illustrate a pulse width modulation control system having a 1 MHz switching frequency, this PWM technique may be used at even higher frequencies (for example, 4 MHz) where smaller pulse widths are required for driving the converter.

While several particular forms of the invention have been illustrated and described, it will also be apparent that various modifications may be made without departing from the scope of the invention. It is also contemplated that various combinations or subcombinations of the specific features and aspects of the disclosed embodiments may be combined with or substituted for one another in order to form varying modes of the invention. Accordingly, it is not intended that the invention be limited, except as by the appended claims.

The invention claimed is:

1. A circuit for pulse width modulation comprising:
   a clocking circuit capable of generating a periodic set signal having a rising set edge and a falling set edge;
   an oscillator capable of generating a ramp signal, wherein the ramp signal starts to rise before the falling set edge of the periodic set signal and after the rising set edge of the periodic set signal;
   a comparator configured to receive a control signal and the ramp signal, the comparator capable of generating a reset signal based on the control signal and the ramp signal;
   a latching circuit configured to receive the reset signal and the periodic set signal, the latching circuit capable of generating a pulse width modulated signal having a switching frequency, wherein the ramp signal starts to rise before the falling set edge of the periodic set signal and after the rising set edge of the periodic set signal.

2. The circuit of claim 1, wherein the periodic set signal has a pulse width of about 25 percent of the period of the switching frequency at the midpoint of the pulse width of the periodic set signal.

3. The circuit of claim 1, wherein the pulse width modulated signal has a rising PWM edge and a falling PWM edge, and the ramp signal is a sawtooth waveform that starts to rise before the rising PWM edge of the pulse width modulated signal.

4. The circuit of claim 1, wherein the periodic set signal and a periodic ramp reset signal are input to the oscillator to generate the ramp signal, the periodic ramp reset signal having a rising ramp reset edge and a falling ramp reset edge,
   wherein the rising ramp reset edge coincides with the rising set edge of the periodic set signal, and the falling ramp reset edge occurs before the falling set edge,
   such that the falling ramp reset edge of the periodic ramp reset signal causes the ramp signal to rise, and the rising set edge of the periodic set signal causes the ramp signal to fall.

5. The circuit of claim 1, wherein the control signal is a feedback voltage error signal produced by an amplifier, and the feedback voltage error signal intersects the ramp signal at a substantially linear region of the ramp signal.

6. The circuit of claim 1, wherein the comparator is an operational amplifier having a supply voltage of about 3.3 volts.

7. The circuit of claim 1, wherein the reset signal is generated by the comparator to rise before the periodic set signal falls to produce a zero percent duty cycle.

8. A circuit for pulse width modulation comprising:
   a clocking circuit capable of generating a periodic set signal having a rising set edge and a falling set edge;
   an oscillator capable of generating a ramp signal, wherein the ramp signal starts to rise before the falling set edge of the periodic set signal and after the rising set edge of the periodic set signal, and the ramp signal falls with the rising set edge of the periodic set signal;
   an amplifier for producing a control signal;
   a comparator configured to receive the control signal and the ramp signal, the comparator capable of generating a reset signal having a rising reset edge and a falling reset edge based on the intersection of the control signal and the ramp signal;
   a latching circuit configured to receive the reset signal and the periodic set signal having, the latching circuit capable of generating a pulse width modulated signal having a PWM rising edge, a PWM falling edge, and a PWM switching frequency; wherein the PWM rising edge is triggered by the falling set edge and the PWM falling edge is triggered by the rising reset edge, and the ramp signal starts to rise before the rising PWM edge of the pulse width modulated signal.

9. The circuit of claim 8, wherein the periodic set signal has a pulse width of about 25 percent of the period of the switching frequency, and the ramp signal is a sawtooth waveform that starts to rise at the midpoint of the pulse width of the periodic set signal.

10. The circuit of claim 8, wherein the oscillator uses the periodic set signal and a periodic ramp reset signal as inputs to generate ramp signal such that the ramp signal starts to rise before the falling edge of the periodic set signal, and the rising ramp reset edge coincides with the rising set edge,
   wherein the falling ramp reset edge of the periodic ramp reset signal occurs before the falling set edge of the periodic set signal, such that the falling ramp reset edge of the periodic ramp reset signal causes the ramp signal to rise, and the rising set edge of the periodic set signal causes the ramp signal to fall.

11. The circuit of claim 8, wherein the pulse width modulated signal is used to produce an output voltage, and the amplifier produces a feedback voltage error signal as the control signal based on the output voltage and a reference voltage.

12. The circuit of claim 8, wherein the comparator is an operational amplifier having a supply voltage of about 3.3 volts.

13. The circuit of claim 8, wherein the rising reset edge of the reset signal occurs before the falling set edge of the periodic set signal to produce a zero percent duty cycle with no ramp offset.

14. A method for pulse width modulation comprising:
   generating a periodic set signal having a rising edge and a falling edge;
   generating a ramp signal, wherein the ramp signal starts to rise before the falling edge of the periodic set signal and after the rising edge of the periodic set signal;

comparing the ramp signal to a control signal to generate a reset signal having a reset rising edge and a reset falling edge;

latching the reset signal and the periodic set signal to produce a pulse width modulated signal having a PWM rising edge, a PWM falling edge, a PWM switching frequency.

15. The method of claim 14, wherein the periodic set signal has a pulse width of about 25 percent of the period of the PWM switching frequency, and the ramp signal is a sawtooth waveform that starts to rise at the midpoint of the pulse width of the periodic set signal.

16. The method of claim 14, wherein the step of generating the periodic set signal includes using an internal clock configured to operate at quadruple the switching frequency of the pulse width modulation signal.

17. The method of claim 14, wherein the control signal is a feedback voltage error signal, and the feedback voltage error signal intersects the ramp signal at a substantially linear region of the ramp signal.

18. The method of claim 14, wherein the ramp signal starts to rise before the rising PWM edge of the pulse width modulated signal.

19. The method of claim 14, further comprising the steps of:

generating a periodic ramp reset signal having a rising ramp reset edge, a falling ramp reset edge, and a ramp reset pulse width having a selected pulse width less than the pulse width of the periodic set signal, wherein the rising ramp reset edge coincides with the rising edge of the periodic set signal, and the step of generating the ramp signal further includes the step of latching the periodic ramp reset signal and the periodic set signal so that the ramp signal starts to rise at a falling ramp reset edge of the ramp reset signal and starts to fall at rising set edge of the periodic set signal.

20. The method of claim 14, wherein the reset signal rises before the periodic set signal falls to produce a zero percent duty cycle.

* * * * *